(12) United States Patent
St. Lawrence et al.

(10) Patent No.: US 6,602,583 B2
(45) Date of Patent: Aug. 5, 2003

(54) LIQUID CRYSTALLINE POLYMER BOND PLIES AND CIRCUITS FORMED THEREFROM

(75) Inventors: Michael E. St. Lawrence, Thompson, CT (US); Scott Kennedy, Canterbury, CT (US)

(73) Assignee: World Properties, Inc., Lincolnwood, IL (US)

(*) Notice: Subject to any disclaimer, the term of this patent is extended or adjusted under 35 U.S.C. 154(b) by 0 days.

(21) Appl. No.: 10/006,990

(22) Filed: Dec. 4, 2001

(65) Prior Publication Data

US 2002/0076538 A1 Jun. 20, 2002

Related U.S. Application Data
(60) Provisional application No. 60/255,597, filed on Dec. 14, 2000.

(51) Int. Cl.[7] .................................................. B32B 3/00
(52) U.S. Cl. ...................... 428/209; 174/258; 174/259; 428/901
(58) Field of Search ................................ 428/209, 901; 174/256, 258, 259

(56) References Cited

U.S. PATENT DOCUMENTS

| | | | |
|---|---|---|---|
| 4,737,398 A | 4/1988 | Ikenaga et al. ............. 428/216 |
| 4,863,767 A | 9/1989 | Garg et al. ..................... 428/1 |
| 4,876,120 A | 10/1989 | Belke et al. ................... 428/1 |
| 4,942,095 A | 7/1990 | Buchert et al. ............. 428/461 |
| 4,963,428 A | 10/1990 | Harvey et al. .............. 428/220 |
| 4,966,806 A | 10/1990 | Lusignea et al. ........... 428/220 |
| 4,966,807 A | 10/1990 | Harvey et al. .............. 428/220 |
| 4,975,312 A | 12/1990 | Lusignea et al. ........... 428/209 |
| 5,164,458 A | 11/1992 | Jennings et al. ............ 525/389 |
| 5,259,110 A | 11/1993 | Bross et al. .................. 29/830 |
| 5,288,529 A | 2/1994 | Harvey et al. .................. 428/1 |
| 5,360,672 A | 11/1994 | Saito et al. ................. 428/480 |
| 5,529,740 A | 6/1996 | Jester et al. ................. 264/317 |
| 5,545,475 A * | 8/1996 | Korleski ................... 428/306.6 |
| 5,703,202 A | 12/1997 | Jester et al. ................. 528/481 |
| 5,719,354 A | 2/1998 | Jester et al. ................. 174/255 |
| 5,863,405 A | 1/1999 | Miyashita ................... 205/125 |
| 5,863,666 A | 1/1999 | Merchant et al. ........... 428/544 |
| 5,900,292 A | 5/1999 | Moriya ........................... 428/1 |
| 5,997,765 A | 12/1999 | Furuta et al. ........... 252/299.01 |
| 6,027,771 A | 2/2000 | Moriya ........................... 428/1 |
| 6,274,242 B1 | 8/2001 | Onodera et al. .......... 428/411.1 |
| 6,296,949 B1 | 10/2001 | Bergstresser et al. ....... 428/626 |
| 6,403,211 B1 | 6/2002 | Yang et al. ............... 428/308.4 |
| 2001/0005545 A1 | 6/2001 | Andou et al. ............... 428/209 |
| 2002/0028293 A1 | 3/2002 | Yang et al. ................. 427/304 |
| 2002/0037397 A1 | 3/2002 | Suzuki et al. ............... 428/209 |

FOREIGN PATENT DOCUMENTS

| | | |
|---|---|---|
| CA | 2273542 | 12/1999 |
| EP | 0 484 818 A2 | 10/1991 |
| EP | 0 507 332 A2 | 7/1992 |
| EP | 0697278 B1 | 2/1996 |
| EP | 0 951 206 A2 | 3/1999 |

(List continued on next page.)

OTHER PUBLICATIONS

96/08361
International Search Report, mailed Jul. 16, 2002.

*Primary Examiner*—Cathy Lam
(74) *Attorney, Agent, or Firm*—Cantor Colburn LLP

(57) ABSTRACT

A multi-layer circuit board comprises a liquid crystalline polymer bond ply disposed between two circuit layers wherein the liquid crystalline polymer bond ply is formed by treating a film comprising a liquid crystalline polymer with an amount of heat and pressure effective to produce a liquid crystalline polymer bond ply with an in-plane coefficient of thermal expansion (CTE) of 0 to about 50 ppm/° C. and further wherein the multi-layer circuit is formed by lamination at a temperature of 0° C. to about 10° C. less than the melt temperature of the liquid crystalline polymer.

10 Claims, 1 Drawing Sheet

FOREIGN PATENT DOCUMENTS

| | | |
|---|---|---|
| EP | 0949067 A2 | 10/1999 |
| EP | 1044800 A1 | 10/2000 |
| JP | 4367763 | 12/1992 |
| JP | 065097614 | 4/1994 |
| JP | Hei 7-3033 | 1/1995 |
| JP | 00280341 A | 10/2000 |
| JP | P2001-244630 A | 7/2001 |
| WO | WO 96/08361 | 3/1996 |
| WO | WO 97/19127 | 5/1997 |

* cited by examiner

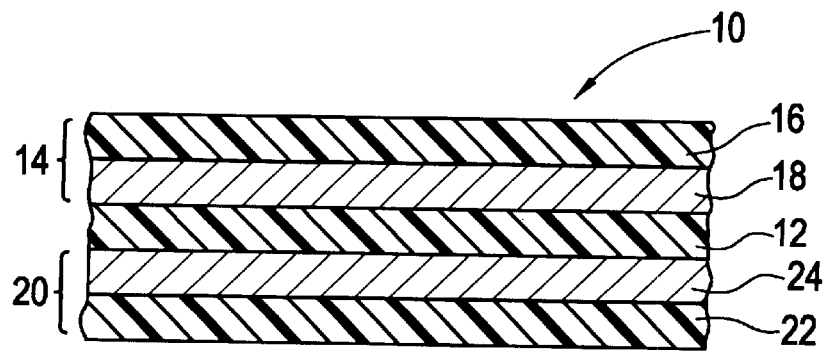
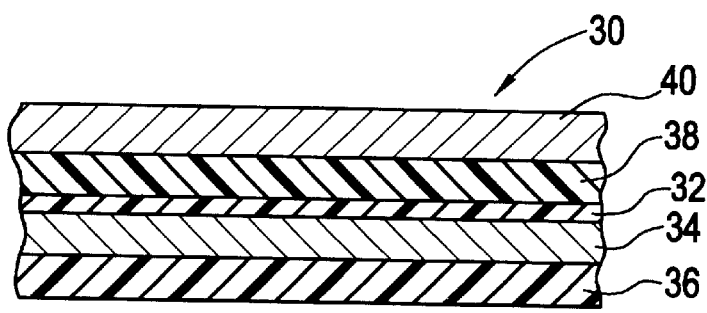
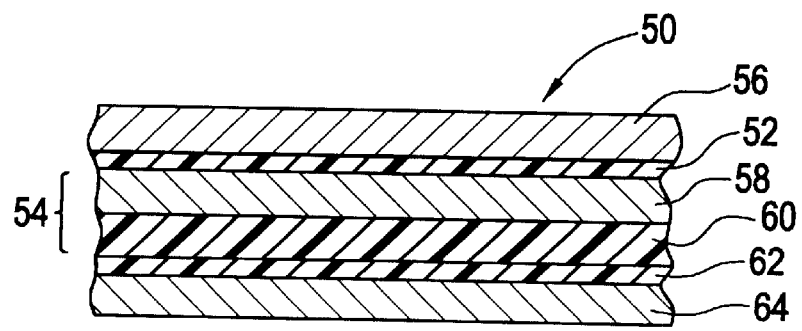

LIQUID CRYSTALLINE POLYMER BOND PLIES AND CIRCUITS FORMED THEREFROM

CROSS REFERENCE TO RELATED APPLICATIONS

This application claims the benefits of U.S. Provisional Patent application Serial No. 60/255,597 filed Dec. 14, 2000, which is fully incorporated herein by reference.

BACKGROUND OF THE INVENTION

The present invention relates to liquid crystalline polymers, and in particular to liquid crystalline polymer films used in the formation of multi-layer circuits.

Liquid crystalline polymer (LCP) films are useful in laminates and printed circuits because they typically exhibit low moisture absorption, excellent heat resistance, and good high frequency properties. Despite these advantages, LCP films have not gained wide acceptance and use because they are difficult to laminate consistently. This is due at least in part because the coefficient of thermal expansion (CTE) and the dimensional stability of LCPs are very sensitive to temperature, and the flow properties of LCPs are sensitive to pressure. Additionally, the melt temperature of the LCP film can be altered upon exposure to high temperatures. To achieve uniform lamination of LCP films, lamination equipment must be capable of producing high temperature and pressure conditions in an accurate and uniform manner. Such equipment is costly and has proved to be a barrier to widespread application of LCP film in printed circuits, particularly multi-layer circuits. EP 507 332 discloses how to make a laminate comprising a liquid crystalline polymer using roll lamination, but does not disclose a pretreatment to adjust the coefficient of thermal expansion (CTE).

U.S. Pat. No. 5,360,672 discloses treating a liquid crystalline polymer film below the melt point of the film to improve the cohesive strength of the film, but does not adjust the CTE of the film.

In order to make a multi-layer printed circuit the individual circuits must be bonded together with a material so as to cover the circuit features and act as a dielectric. This can be accomplished by use of a polymeric adhesive or bond ply. Adhesives can be in solid or liquid form. A bond ply is solid and is often preferred because it is non-tacky, self-supporting, and easier to use.

Canadian Application No. 2,273,542 to Forcier suggests use of liquid crystalline polymers as adhesives in the formation of laminates comprising an LCP film bonded to copper, but provides no teaching with respect to the formation of multi-layer circuits using LCP to adhere two dielectric layers, with or without electronic circuitry on their surfaces.

U.S. Pat. No. 6,274,242 to Onodera et al. discloses making a laminate material comprising a liquid crystalline polymer that has been subjected to a heat treatment comprising sequential heating steps below the melt temperature of the film. Onodera et al. thus teaches a specific heat treatment to increase the heat resistance of the film, not the creation of an adhesive layer for circuits.

There are no known reports of the use of LCP films as bond ply layers, most likely because of the above-described sensitivity of the CTE, lamination temperature, and flow properties of LCP films. Currently available LCP films require relatively high lamination temperatures, generally near or above the temperature of conventional electric presses, and are extremely sensitive to temperature uniformity. Accordingly, there is a need in the art for methods for the manufacture of LCP films more suitable for use as bond plies, as well as method for the manufacture of multi-layer printed circuit boards comprising LCP bond plies.

BRIEF SUMMARY OF THE INVENTION

The above-described drawbacks and disadvantages are alleviated by a multi-layer circuit comprising a liquid crystalline polymer bond ply disposed between two circuits, wherein the liquid crystalline polymer bond ply is formed by treating a liquid crystalline polymer film with an amount of heat and pressure effective to produce a liquid crystalline polymer bond ply with an in-plane coefficient of thermal expansion (CTE) of 0 to about 50 ppm/° C., and further wherein the multi-layer circuit is formed by lamination at a temperature of 0° C. to about 15° C. less than the melt temperature of the liquid crystalline polymer bond ply.

Use of the liquid crystalline bond ply in the formation of a multi-layer circuit board allows formation of the multi-layer circuit board under a wider range of temperatures and pressures than heretofore possible. The above discussed and other features and advantages of the present invention will be appreciated and understood by those skilled in the art from the following detailed description.

BRIEF DESCRIPTION OF THE DRAWINGS

Referring now to the exemplary drawings,

FIG. 1 is a schematic representation of a multi-layer circuit board.

FIG. 2 is a schematic representation of an alternative multi-layer circuit board.

FIG. 3 is a schematic representation of another alternative multi-layer circuit board.

DETAILED DESCRIPTION OF THE PREFERRED EMBODIMENTS

A liquid crystalline polymer bond ply is formed by treating a liquid crystalline polymer film with an amount of heat and pressure effective to produce a liquid crystalline polymer bond ply with an in-plane (X-Y) CTE of 0 to about 50 ppm/° C. The liquid crystalline polymer bond ply may then be combined with circuits made with a variety of materials to produce a multi-layer circuit by lamination at a temperature that is 0 to about 15° C. less than the melt temperature of the liquid crystalline polymer. The treatment of the liquid crystalline polymer film to make it suitable for use as a bond ply results in a liquid crystalline polymer bond ply with a lower multi-layer circuit board lamination temperature, a larger acceptable temperature range and a larger acceptable pressure range. Use of the liquid crystalline bond ply makes the formation of the multi-layer circuit boards less sensitive to fluctuations in temperature and pressure and requires a lower multi-layer circuit board lamination temperature than has been previously possible with liquid crystalline polymers, thereby enabling the formation of multi-layer circuit boards having a liquid crystalline polymer bond ply using conventional electric lamination presses.

Liquid crystalline polymers suitable for the formation of bond plies are known, and are sometimes described as "rigid-rod", "rod-like", or ordered polymers. These polymers are believed to have a fixed molecular shape, e.g. linear, or the like, due to the nature of the repeating units comprising the polymeric chain. The repeating units typically comprise rigid molecular elements. The rigid molecular elements (mesogens) are frequently rod-like or disk-like in shape and are typically aromatic and frequently heterocyclic. The rigid molecular elements may be present in either the main chain (backbone) of the polymer or in the side chains. When present in the main chain or in the side chains they may be separated by more flexible molecular elements, sometimes referred to as spacers.

Liquid crystalline polymers can be blended with polymers that are not liquid crystalline polymers, hereinafter referred to as non-liquid crystalline polymers. These blends are sometimes referred to as polymer alloys. Some of these blends have processing and functional characteristics similar to liquid crystalline polymers and are thus included within the scope of the present invention. The non-liquid crystalline polymers and liquid crystalline polymer components are generally mixed in a weight ratio of 10:90 to 90:10, preferably in the range of 30:70 to 70:30. Hereinafter the term liquid crystalline polymer will include liquid crystalline polymer blends.

Both thermotropic and lyotropic liquid crystalline polymers are useful. Furthermore, useful liquid crystalline polymers can be thermoplastic or thermosetting. Suitable thermotropic liquid crystalline polymers include liquid crystal polyesters, liquid crystal polycarbonates, liquid crystal polyetheretherketone, liquid crystal polyetherketoneketone and liquid crystal polyester imides, specific examples of which include (wholly) aromatic polyesters, polyester amides, polyamide imides, polyester carbonates, and polyazomethines.

Useful thermotropic liquid crystalline polymers also include polymers comprising a segment of a polymer capable of forming an anisotropic molten phase as part of one polymer chain thereof and a segment of a polymer incapable of forming an anisotropic molten phase as the rest of the polymer chain, and also a composite of a plurality of thermotropic liquid crystalline polymers.

Representative examples of the monomers usable for the formation of the thermotropic liquid crystalline polymer include: (a) an aromatic dicarboxylic acid compound, (b) an aromatic hydroxy carboxylic acid compound, (c) an aromatic diol compound, (d) an aromatic dithiol ($d_1$), an aromatic thiophenol ($d_2$), and an aromatic thiol carboxylic acid compound ($d_3$), or (e) an aromatic hydroxyamine compound and an aromatic diamine compound. They may sometimes be used alone, but may frequently be used in a combination of monomers (a) and (c); (a) and (d); (a), (b) and (c); (a), (b) and (e); (a), (b), (c) and (e); or the like.

Examples of the aromatic dicarboxylic acid compound (a) include aromatic dicarboxylic acids such as terephthalic acid, 4,4'-diphenyldicarboxylic acid, 4,4'-triphenyldicarboxylic acid, 2,6-naphthalenedicarboxylic acid, 1,4-naphthalenedicarboxylic acid, 2,7-naphthalenedicarboxylic acid, diphenyl ether-4,4'-dicarboxylic acid, diphenoxyethane-4,4'-dicarboxylic acid, diphenoxybutane-4,4'-dicarboxylic acid, diphenylethane-4,4'-dicarboxylic acid, isophthalic acid, diphenyl ether-3,3'-dicarboxylic acid, diphenoxyethane-3,3'-dicarboxylic acid, diphenylethane-3,3'-dicarboxylic acid, and 1,6-naphthalenedicarboxylic acid; and alkyl-, alkoxy- and halogen-substituted derivatives of the above-mentioned aromatic dicarboxylic acids, such as chloroterephthalic acid, dichloroterephthalic acid, bromoterephthalic acid, methylterephthalic acid, dimethylterephthalic acid, ethylterephthalic acid, methoxyterephthalic acid, and ethoxyterephthalic acid.

Examples of the aromatic hydroxy carboxylic acid compound (b) include aromatic hydroxy carboxylic acids such as 4-hydroxybenzoic acid, 3-hydroxybenzoic acid, 6-hydroxy-2-naphthoic acid, and 6-hydroxy-1-naphthoic acid; and alkyl-, alkoxy- and halogen-substituted derivatives of the aromatic hydroxy carboxylic acids, such as 3-methyl-4-hydroxybenzoic acid, 3,5-dimethyl-4-hydroxybenzoic acid, 6-hydroxy-5-methyl-2-naphthoic acid, 6-hydroxy-5-methoxy-2-naphthoic acid, 2-chloro-4-hydroxybenzoic acid, 3-chloro-4-hydroxybenzoic acid, 2,3-dichloro-4-hydroxybenzoic acid, 3,5-dichloro-4-hydroxybenzoic acid, 2,5-dichloro-4-hydroxybenzoic acid, 3-bromo-4-hydroxybenzoic acid, 6-hydroxy-5-chloro-2-naphthoic acid, 6-hydroxy-7-chloro-2-naphthoic acid, and 6-hydroxy-5,7-dichloro-2-naphthoic acid.

Examples of the aromatic diol compound (c) include aromatic diols such as 4,4'-dihydroxydiphenyl, 3,3'-dihydroxydiphenyl, 4,4'-dihydroxytriphenyl, hydroquinone, resorcinol, 2,6-naphthalenediol, 4,4'-dihydroxydiphenyl ether, bis(4-hydroxyphenoxy)ethane, 3,3'-dihydroxydiphenyl ether, 1,6-naphthalenediol, 2,2-bis(4-hydroxyphenyl)propane, and bis(4-hydroxyphenyl)methane; and alkyl-, alkoxy- and halogen-substituted derivatives of the aromatic diols, such as chlorohydroquinone, methylhydroquinone, t-butylhydroquinone, phenylhydroquinone, methoxyhydroquinone, phenoxyhydroquinone, 4-chlororesorcinol, and 4-methylresorcinol.

Examples of the aromatic dithiol ($d_1$) include benzene-1,4-dithiol, benzene-1,3-dithiol, 2,6-naphthalene-dithiol, and 2,7-naphthalene-dithiol. Examples of the aromatic thiophenol ($d_2$) include 4-mercaptophenol, 3-mercaptophenol, and 6-mercapto-phenol. Examples of the aromatic thiol carboxylic acid ($d_3$) include 4-mercaptobenzoic acid, 3-mercaptobenzoic acid, 6-mercapto-2-naphthoic acid, and 7-mercapto-2-naphthoic acid.

Examples of the aromatic hydroxyamine compound and the aromatic diamine compound (e) include 4-aminophenol, N-methyl-4-aminophenol, 1,4-phenylenediamine, N-methyl-1,4-phenylenediamine, N,N'-dimethyl- 1,4-phenylenediamine, 3-aminophenol, 3-methyl-4-aminophenol, 2-chloro-4-aminophenol, 4-amino-12-naphthol, 4-amino-4'-hydroxydiphenyl, 4-amino-4'-hydroxydiphenyl ether, 4-amino-4'-hydroxydiphenylmethane, 4-amino-4'-hydroxydiphenyl sulfide, 4,4'-diaminodiphenyl sulfide (thiodianiline), 4,4'-diaminodiphenyl sulfone, 2,5-diaminotoluene, 4,4'-ethylenedianiline, 4,4'-diaminodiphenoxyethane, 4,4'-diaminodiphenylmethane (methylenedianiline), and 4,4'-diaminodiphenyl ether (oxydianiline).

Thermotropic liquid crystalline polymers are prepared from monomer(s) as mentioned above by a variety of esterification methods such as melt acidolysis or slurry polymerization, or like methods.

The molecular weight of the thermotropic liquid crystalline polyester that may be used may be about 2,000 to 200,000, preferably 4,000 to 100,000. The measurement of the molecular weight may be done, for example, either through determination of the terminal groups of a compressed film thereof according to infrared spectroscopy, or by gel permeation chromatography (GPC).

Thermotropic liquid crystalline polymers may be used either alone or in mixture of at least two thereof. A preferred thermotropic liquid crystalline polymer is 2-naphthalene carboxylic acid, 6-(acetyloxy)-polymer with 4-(acetyloxy) benzoic acid.

Suitable lyotropic liquid crystalline polymers include concentrated sulfuric acid solutions of poly(p-phenylene terephthalamide) (PPTA), silk fibroin aqueous solutions, and sericin aqueous solutions. A PPTA liquid crystalline polymer is represented by Formula I:

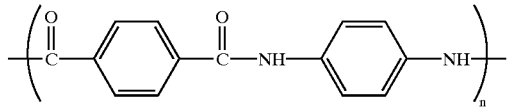

(I)

Possible liquid crystalline polymers which can be used include, but are not limited to, mostly or fully aromatic liquid crystalline polyesters such as VECTRA®, commercially available from Ticona, XYDAR®, commercially available from Amoco Polymers, and ZENITE®, commercially available from DuPont, among others. An especially preferred liquid crystalline polymer film is based on copolymer of hydroxy benzoate/hydroxy naphthoate, known commercially as VECSTAR, available from Kuraray Co., Ltd., Japan. The liquid crystalline polymers and polymer blends described hereinabove are meant for illustration and not for limitation, as many other suitable liquid crystalline polymers and polymer blends are known in the art. Likewise, it is recognized that compatibilizers, plasticizers, flame retardant agents, and other additives may be contained in the liquid crystalline polymers.

When used to form bond plies, the liquid crystalline polymer material is in sheet or roll form. Effective thicknesses vary, but are generally in the range from about 13 to about 200 micrometers, and preferably from about 25 to about 102 micrometers. It is preferable for the liquid crystalline polymer to have a melt temperature in the range of about 250° C. to about 350° C.

The CTE of a typical liquid crystalline polymer film in the X-Y plane can be a positive or a negative value or zero. To be used effectively as a bond ply for circuits, particularly printed circuit boards, the X-Y CTE must generally be adjusted to match the X-Y CTE of the material it is being bonded to. It has been discovered by the inventors hereof that when the in-plane CTE of the liquid crystalline polymer films is adjusted to a value from 0 to about 50 ppm/° C., a bond ply may be formed which can then be laminated to a circuit board to form a multilayer circuit at a temperature of 0° C. to about 15° C. less than the melt temperature of the liquid crystalline polymer. This enables the bond ply to be used to make multi-layer circuits using conventional lamination equipment. When the bond ply is used to make a multi-layer circuit board at a lamination temperature of 0° C. to about 15° C. less than the melt temperature of the liquid crystalline polymer the bond ply has good flow and fill properties. In contrast, lamination with untreated LCP films requires very tight temperature control (for example ±1° C.) for temperatures above the melt temperatures of the untreated LCP film. Importantly, the lower lamination temperature of the bond ply allows the use of conventional equipment and lamination to the circuit board without further changing the CTE or the melt temperature of the bond ply.

Selection of film treatment temperatures and pressures effective to adjust the CTE of the LCP film depends primarily on the identity of the LCP, the desired CTE, and the thickness of the film. For VECSTART™ FA films from Kuraray (melt temperatures of 200° C.) that are about 50 micrometers thick, appropriate temperatures may be selected from the range of about 280 to about 330° C. (wherein the selected temperature is controlled to ±1° C.) and appropriate pressures may be selected from the range of about 0.5 to about 1.4 MegaPascals (Mpa) in order to adjust the in-plane CTE to 0 to 50 ppm/° C.

Preferably, the liquid crystalline polymer film is subjected to in-plane CTE adjustment treatment while in contact with at least one release material or carrier. Useful release materials and carriers are capable of adhering to the liquid crystalline polymer film under the appropriate heat and pressure with a bond strength which is low enough to allow the removal of the release material/carrier without disrupting the integrity of the treated liquid crystalline polymer film but high enough to provide adequate support. Examples of suitable materials are known, and include but are not limited to polytetrafluoroethylene (PTFE) films, PTFE-coated films such as PTFE-coated polyimide films, polyimide films, PTFE-coated metal foils, and smooth metal foils coated with a zirconate coating.

The liquid crystalline polymer bond ply may be manufactured by either a continuous or batch process. For continuous manufacture of the liquid crystalline polymer bond ply, the liquid crystalline polymer film may be placed between two release material sheets, which may then be fed through a nip at a temperature of about 250 to about 300° C., at a nip pressure of about 100 to about 300 pounds per linear inch (pli), and then optionally fed through an annealing oven at a temperature of about 250 to about 330° C. in order to further adjust the in-plane CTE of the liquid crystalline polymer bond ply. The nip and/or the annealing oven may optionally be operated under vacuum or an inert atmosphere. The liquid crystalline polymer bond ply is then cooled quickly and the release materials may be removed. The liquid crystalline polymer bond plies may then be stored until used.

In another embodiment the liquid crystalline polymer bond ply is made by a batchwise or semi-continuous process. In an exemplary batch process, the liquid crystalline polymer film is placed between two release material sheets, which are then placed in a flat bed press. The press is preferably evacuated to form a vacuum. For VECSTAR™ FA film from Kuraray, the temperature is generally increased at a rate of about 4 to about 8° C./minute. Once the temperature reaches about 180° C., the pressure may be increased to about 0.7 Mpa, and maintained at about 0.7 MPa until the desired temperature is reached. The desired temperature depends upon the composition of the liquid crystalline polymer, and for VECSTAR™ FA films, is typically in the range of about 250 to about 330° C. At the desired temperature the pressure is set to a desired pressure of about 0.5 MPa to about 1.4 MPa, and held at the desired temperature for about 1 to about 15 minutes. The material is then cooled as quickly as possible while maintaining the desired pressure. The bond ply is removed from the press when the temperature is 100° C. or lower, the release materials optionally removed, and the resulting bond ply stored.

The liquid crystalline polymer bond ply may then be used to form a multi-layer circuit. Circuits generally comprise a dielectric substrate and at least one conductive layer (the circuitry) disposed thereon. The circuits may be selected from those known in the art, and include both circuit boards and flexible circuits. Exemplary dielectric materials include polytetrafluoroethylene, polybutadiene, polyphenylene ethers, epoxy, liquid crystalline polymers, and combinations comprising at least one of the foregoing. Exemplary conductive materials include those such as aluminum, silver, iron, copper, nickel, stainless steel and combinations comprising at least one of the foregoing.

Conditions for multi-layer circuit board formation by lamination depend on the identities and thicknesses of the bond ply, and the circuit materials. Formation of the multi-layer circuit may also be continuous or batchwise. Where the LCP is thermotropic, for example, a continuous process proceeds by placing the liquid crystalline polymer bond ply between two circuit layers (which may be the same or different), and then feeding the layers through a nip at a temperature and pressure effective to ensure the bond ply adheres to the contacting surfaces of the circuit layers, thereby bonding the circuit layers. Useful nip temperatures are 0 to about 15° C., preferably 0 to about 10° C. less than the melt temperature of the bond ply. Useful pressures are in the range of about 50 to about 400 pounds per linear inch (pli). The laminate is then cooled and may then be stored until used.

In an exemplary batchwise process, the liquid crystalline polymer bond ply is placed between two circuit layers which may be the same or different, and placed in a flat bed press. The flat bed press may be evacuated to form a vacuum. The temperature is then typically increased at a rate of about 1 to about 8° C./minute. Once the temperature reaches about 180° C. the pressure may be increased from 0 psi to about 0.7 MPa. The pressure is usually maintained at 0.7 MPa until the temperature reaches the desired temperature, which depends upon the composition of the liquid crystalline polymer, but is typically 0 to about 15° C., preferably 0 to about 10° C. less than the melt temperature of the bond ply. At the desired temperature the pressure is increased to a pressure of about 2.8 MPa to about 7.6 Mpa, and then the temperature and pressure are maintained for about 1 to about 15 minutes. The resulting multi-layer circuit is then cooled, preferably while maintaining the pressure. The multi-layer circuit may be removed from the press when the temperature is 100° C. or lower, and stored until used.

An exemplary multi-layer circuit is shown in FIG. 1. Multi-layer circuit 10 generally comprises a liquid crystalline bond ply 12 as described above disposed between a first circuit layer 14 and a second circuit layer 20. First circuit layer 14 comprises a first conductive layer 16 supported by a first dielectric layer 18. Second circuit layer 20 comprises a second dielectric layer 22 supporting second conductive layer 24.

Another configuration of a multilayer circuit is shown in FIG. 2. In FIG. 2, multi-layer circuit 30 comprises a bond ply 32 as described above disposed between a first conductive layer 34 supported by first dielectric layer 36 and a second dielectric layer 38 supporting second conductive layer 40.

In another exemplary configuration of a multi-layer circuit 50, shown in FIG. 3, bond ply 52 is disposed between a conductive layer 56 and a circuit layer, e.g., a printed circuit board 54 comprising a conductive circuit 58 supported by dielectric layer 60. A second bond ply 62 is disposed between third conductive layer 64 and the side of circuit layer 54 opposite that of first bond ply 52.

The invention is further demonstrated by the following examples, which are meant to be illustrative, not limiting.

EXAMPLE

A sheet of VECSTAR™ FA-X-100 LCP film was placed between two sheets of polytetrafluoroethylene (PTFE). VECSTAR™ FA-X-100 LCP film has a melt temperature of 280° C. The three layers were then placed in a flat bed press and heated to 298° C. and 325 psia (pounds per square inch of atmosphere, 2.2 MPa) for 15 minutes. The layers were then cooled and the PTFE layers were removed, resulting in a 50 micrometer thick LCP bond ply with an in-plane CTE of 17 ppm/° C. Three of these bond ply layers were placed separately between four LCP circuit boards, each circuit board comprising two layers of copper with a 50 micrometer LCP dielectric layer disposed between the copper layers. The bond plies and the circuit boards were heated to 275° C. at a rate of 4° C./minute at a pressure of 80 psia in a conventional electric lamination press, pressure was increased to 400 psia, and the temperature was maintained at 275° C. for 10 minutes and then cooled at a rate of 7° C./minute. Pressure was released and the resulting multi-layer circuit board was removed at 100° C. The multilayer circuit board was approximately 457 micrometers thick.

As can be seen from the preceding example, the treatment of the liquid crystalline polymer film results in a liquid crystalline polymer bond ply with an in-plane CTE of 0 to about 50 ppm/° C. and a lower multi-layer circuit board lamination temperature than previously possible. Use of the liquid crystalline bond ply makes the formation of the multi-layer circuit boards less sensitive to fluctuations in temperature and pressure and requires a lower multi-layer circuit board lamination temperature that has not previously been possible with liquid crystalline polymers, thereby enabling the formation of multi-layer circuit boards having a liquid crystalline polymer bond ply using conventional electric lamination presses.

While preferred embodiments have been shown and described, various modifications and substitutions may be made thereto without departing from the spirit and scope of the invention. Accordingly, it is to be understood that the present invention has been described by way of illustration and not limitation.

What is claimed is:

1. A multi-layer circuit comprising
   a first circuit layer;
   a second circuit layer; and
   a liquid crystalline polymer bond ply disposed between the first and the second circuit layers, wherein
      the liquid crystalline polymer band ply is formed by treating a film comprising
         a liquid crystalline polymer with an amount of heat and pressure effective to produce
         a liquid crystalline polymer bond ply with an in-plane coefficient of thermal expansion of 0 to about 50 ppm/° C.;
   wherein the multi-layer circuit is formed by laminating the first circuit layer, the second circuit layer, and the film at a temperature from 0° C. to about 15° C. less than the melt temperature of the liquid crystalline polymer bond ply.

2. The multi-layer circuit of claim 1 wherein at least one of the circuit layers comprises a dielectric layer supporting at least one conductive layer.

3. The multi-layer circuit of claim 2 wherein The conductive layer is copper.

4. The multi-layer circuit of claim 2 wherein the dielectric layer comprises a resin selected from the group consisting of polybutadiene, polyphenylene ether, epoxy, polytetrafluoroethylene, liquid crystalline polymers, and combinations comprising at least one of the foregoing.

5. The multi-layer circuit of claim 1, wherein the liquid crystalline polymer is a copolymer of hydroxy benzoate/hydroxy naphthoate.

6. The multi-layer circuit of claim 1, wherein the liquid crystalline polymer bond ply has a thickness of about 10 to about 200 micrometers.

7. The multi-layer circuit of claim 1, wherein laminating is at a temperature of 0° C. to about 10° C. less than the melt temperature of the liquid crystalline polymer bond ply.

8. The multi-layer circuit of claim 1, wherein the film comprising a liquid crystalline polymer has a melt temperature of about 250° C. to about 350° C.

9. The multi-layer circuit of claim 1, wherein the film comprising the liquid crystalline polymer is treated at a temperature from about 280° C. to about 330° C. and a pressure from about 0.5 Mpa to about 1.4 Mpa.

10. A multi-layer circuit comprising
- a first conductive metal layer;
- a first circuit layer comprising a first dielectric layer and a first conductive circuit layer;
- a first liquid crystalline polymer bond ply disposed between the conductive metal layer and the first conductive circuit layer of the first circuit layer;
- a second conductive metal layer; and
- a second liquid crystalline polymer bond ply disposed between the dielectric layer of the first circuit layer and the second conductive metal layer, wherein
  the liquid crystalline polymer bond plies are formed by treating a film comprising a liquid crystalline polymer with an amount of heat and pressure effective to produce a liquid crystalline polymer bond ply with an in-plane coefficient of thermal expansion of 0 to about 50 ppm/° C.; and
- further wherein
  the multi-layer circuit board is formed by laminating the layers and the treated films at a temperature from 0° C. to about 15° C. less than the melt temperature of the liquid crystalline polymer bond plies.

* * * * *

UNITED STATES PATENT AND TRADEMARK OFFICE
CERTIFICATE OF CORRECTION

PATENT NO. : 6,602,583 B2  
APPLICATION NO. : 10/006990  
DATED : August 5, 2003  
INVENTOR(S) : St. Lawrence et al.

Page 1 of 1

It is certified that error appears in the above-identified patent and that said Letters Patent is hereby corrected as shown below:

<u>Column 4</u>:
Line 44, after "1" delete "2"

<u>Column 7</u>:
Line 43, after "layer" delete "16" and insert therefore -- 18 --
Line 44, after "layer" delete "18" and insert therefore -- 16 --

Signed and Sealed this

Eighth Day of May, 2007

JON W. DUDAS
*Director of the United States Patent and Trademark Office*